United States Patent [19]

Daido et al.

[11] Patent Number: 4,730,164
[45] Date of Patent: Mar. 8, 1988

[54] DEVICE FOR DETECTING ABNORMAL CONDITIONS IN A STEPPING MOTOR

[75] Inventors: Toshihiko Daido, Osaka; Yoshikazu Ikegi, Nara, both of Japan

[73] Assignee: Koyo Seiko Co., Ltd., Osaka, Japan

[21] Appl. No.: 813,561

[22] Filed: Dec. 26, 1985

[30] Foreign Application Priority Data

Dec. 26, 1984 [JP] Japan ................. 59-273137

[51] Int. Cl.$^4$ ............... G01R 31/34; G01R 31/02
[52] U.S. Cl. ............... 324/545; 324/158 MG; 318/650
[58] Field of Search ........... 324/51, 52, 54, 158 MG, 324/239; 340/648, 646, 870.32; 318/644, 647, 650; 364/483

[56] References Cited

U.S. PATENT DOCUMENTS

| 2,504,395 | 4/1950 | Cross | 324/51 |
| 4,377,784 | 3/1983 | Saito et al. | 340/648 X |
| 4,538,771 | 9/1985 | Tardy | 324/51 X |

Primary Examiner—Reinhard J. Eisenzopf
Assistant Examiner—Jack B. Harvey
Attorney, Agent, or Firm—Finnegan, Henderson, Farabow, Garrett, and Dunner

[57] ABSTRACT

In a device for detecting an abnormal condition in a stepping motor, a second phase coil is provided which is in the relation of mutual induction with a first phase coil of the stepping motor to be tested for an abnormal condition, and the application and non-application of the supply voltage to the first phase coil under test is compared with the variation of the terminal voltage of the second phase coil, to detect the breaking of the first phase coil.

7 Claims, 10 Drawing Figures

4,730,164

DEVICE FOR DETECTING ABNORMAL CONDITIONS IN A STEPPING MOTOR

FIELD OF THE INVENTION

This invention relates to devices for detecting abnormal conditions in stepping motors, and more particularly to a device for detecting abnormal conditions in a stepping motor which is installed in an automobile.

BACKGROUND OF THE INVENTION

In general, a microcomputer is employed to control a variety of operations of an automobile, and a stepping motor may be used as a controlled output. Among the functions of the microcomputer, it is used to diagnose abnormal conditions in control systems, and upon detection of an abnormal condition, the microcomputer functions to return the control system to a safe state. This function is essential for the security of an automobile.

FIG. 5 shows one example of such a control system, namely, a control circuit for a vehicle speed responding device of a power steering device. In FIG. 5, a vehicle speed sensor 1 applies a pulse signal having a frequency corresponding to the vehicle speed as detected from the transmission system, as a control input signal to a microcomputer 2. The microcomputer 2 has output terminals $OA_0$, $OA_1$, $OA_2$ and $OA_3$, and applies a digital signal corresponding to the vehicle speed through the respective output terminal to a driver circuit 3. The driver circuit 3 is adapted to switch on and off the circuits of phase coils A, B, C and D of a stepping motor 4. The stepping motor 4 is a four-phase motor and can take eight (8) rotational positions by selectively applying current to the coils A, B, C and D. As the rotational position changes, the degree of opening of a flow control valve is changed, and the quantity of oil supplied to the power steering device is changed accordingly. That is, aspects of the power steering operation are carried out according to the vehicle speed.

The microcomputer 2 has input terminals $IB_0$, $IB_1$, $IB_2$ and $IB_3$ for self-diagnosing the control system. The input terminals are connected to the output terminals of the driver circuit.

For instance, when the microcomputer 2 applies an output signal (1 0 0 1) to the output terminals $OA_0$ through $OA_3$ to turn on transistors $3_0$ and $3_3$ turn off transistors $3_1$ and $3_2$, and allow current to flow in the coils A and D. A signal (0 1 1 0) is accordingly supplied to the input terminals $IB_0$ through $IB_3$. In this case, the microcomputer 2 compares the output signal (1 0 0 1) with the input signal (0 1 1 0), thus determining that the control system is operating normally.

If, when the output signal is ($a_0$, $a_1$, $a_2$, $a_3$), the input signal is not ($\bar{a}_0$, $\bar{a}_1$, $\bar{a}_2$, $\bar{a}_3$), the microcomputer applies a "0" signal to an output terminal $OB_0$ to turn off the transistor 5 which is inserted in the common power source circuit of the coils A, B, C and D, to deenergize the stepping motor 4. The rotational position of the stepping motor is then set back to the zero position by the elastic force of a spring (not shown), so that the flow rate of oil is made minimum and the power assitance of the power steering is made minimum, i.e., a safe state.

FIG. 6 shows the driver circuit 3 in more detail. Both ends of the coil A connected to the transistor $3_0$ are connected to a protective circuit including a diode $8_0$. The input terminal of a buffer $11_0$ connected to the input terminal $IB_0$ of the microcomputer 2 is connected through a diode $9_0$ to the connecting point of the coil A and the transistor $3_0$. A forward bias is applied through a resistor $10_0$ to the diode $9_0$. The remaining transistors $3_1$, $3_2$ and $3_3$ are also connected in the same manner.

In the above-described control system, it is impossible to self-diagnose the breaking of any of the coils A, B, C and D of the stepping motor 4. For instance in the case where the coil A has been broken, when the logic signal "1" is applied to the output terminal $OA_0$, current flows through the resistor $10_0$ and the diode $9_0$ to the transistor $3_0$ which is turned on, and a signal "0" is applied to the input terminal $IB_0$. That is, when the logic signal ($a_0$) is provided at the output terminal $OA_0$, the logic signal ($\bar{a}_0$) is applied to the input terminal $IB_0$. Therefore, the coil A is erroneously determined to be normal, i.e., the breaking of the coil A is overlooked.

OBJECTS AND SUMMARY OF THE INVENTION

Accordingly, an object of the present invention is a device that can detect abnormal condition in a stepping motor.

Another object of the present invention is a device that can detect broken drive coils in a stepping motor.

A further object of the present invention is a device for safely and accurately controlling a stepping motor.

These and other objects are achieved by a device for detecting an abnormal condition in the coils of a stepping motor comprising a coil in the stepping motor to be tested for an abnormal condition, a search coil provided in a mutual induction relation with the coil to be tested, the search coil having a terminal voltage, and means for selectively applying a voltage to the coil to be tested and for determining the braking of the coil to be tested from the terminal voltage of the search coil.

BRIEF DESCRIPTION OF THE DRAWINGS

The manner by which the above objects and other objects, features, and advantages of the present invention are attained will become more apparent from the following detailed description when it is considered in view of the accompanying drawings, wherein.

DETAILED DESCRIPTION OF THE PREFERRED EMBODIMENTS

Figure 5:
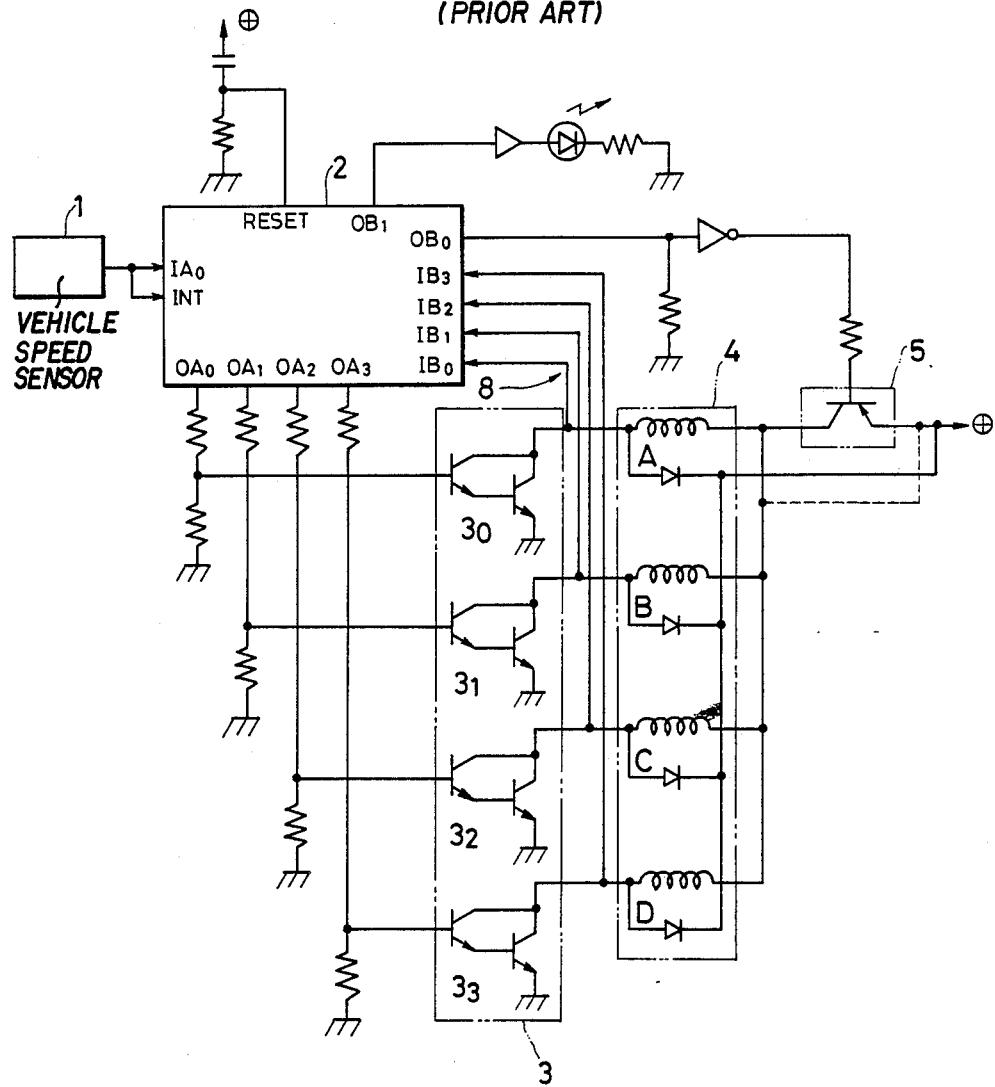
FIG. 5 is a circuit diagram of a conventional control circuit.
Figure 6:
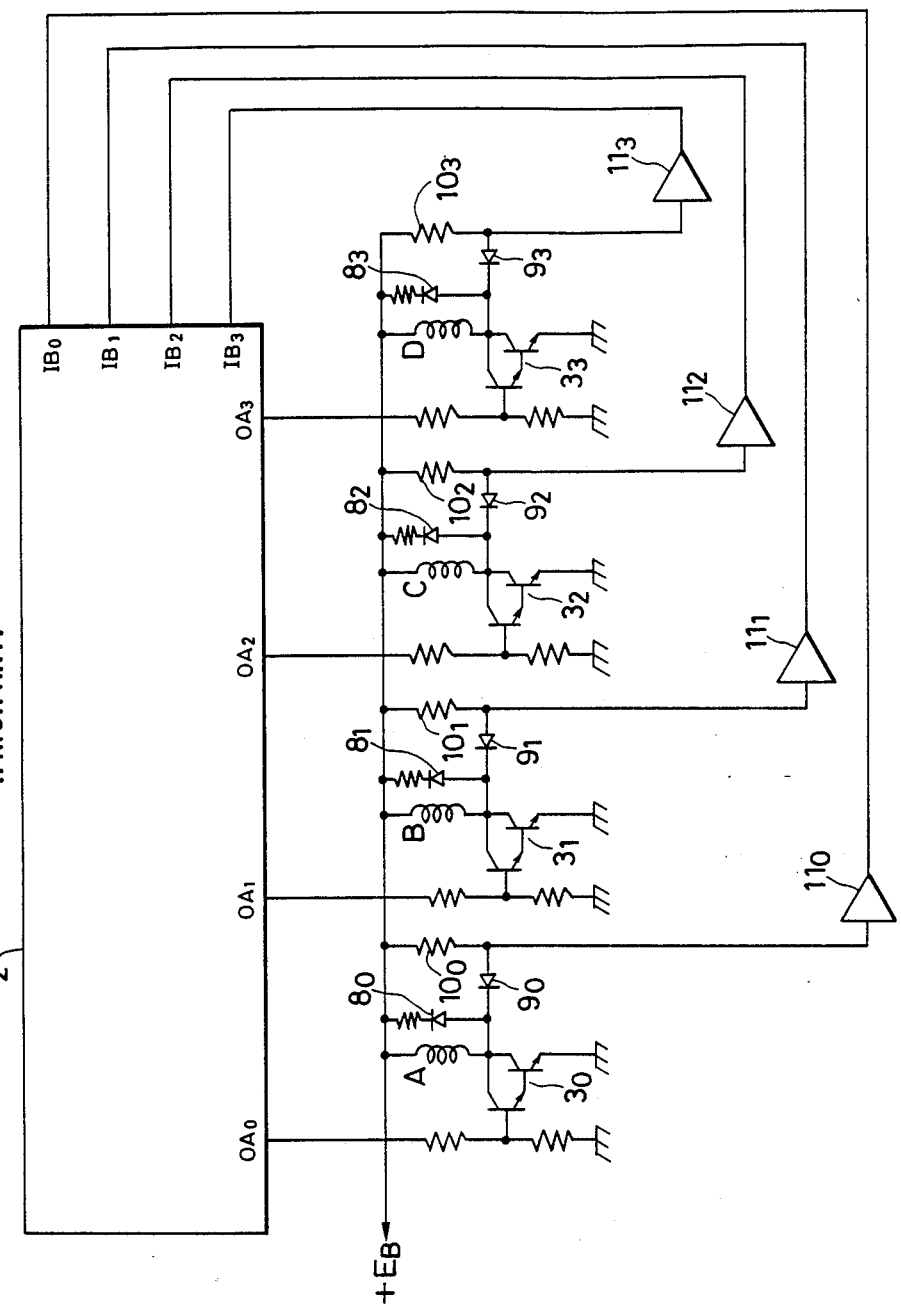
FIG. 6 is a detailed cirucit diagram of the conventional control circuit of FIG. 5.

FIG. 1 shows an embodiment of the present invention. In FIG. 1, reference characters $3_0$, $3_1$, $3_2$ and $3_3$ designate the above-described transistors in the driver cirucit of FIG. 5. The transistors are used to switch on and off circuits of the coils, A, B, C and D of a four-phase stepping motor 4.

Figure 2A:
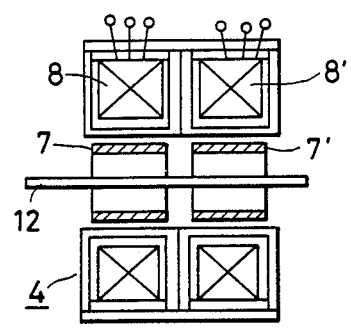
FIG. 2(a) is a sectional view of a four-phase stepping motor.
Figure 2B:
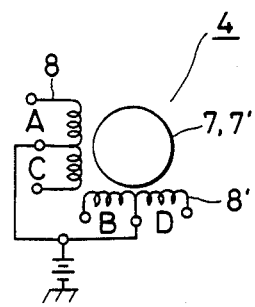
FIG. 2(b) is a circuit diagram of the stepping motor of FIG. 2(a)

As shown in FIG. 2, in the four-phase stepping motor 4 the coils A, B, C and D are provided on the stator and act on the rotors 7 and 7' which are made up of multipolar permanent magnets. The rotors 7 and 7' are fixedly mounted on a common shaft 12. The coils A and C are wound on a bobbin 8, and the coils B and C are wound on a bobbin 8'. The coils A and C act on the rotor 8, while the coils B and D act on the rotor 8'.

Figure 1A:
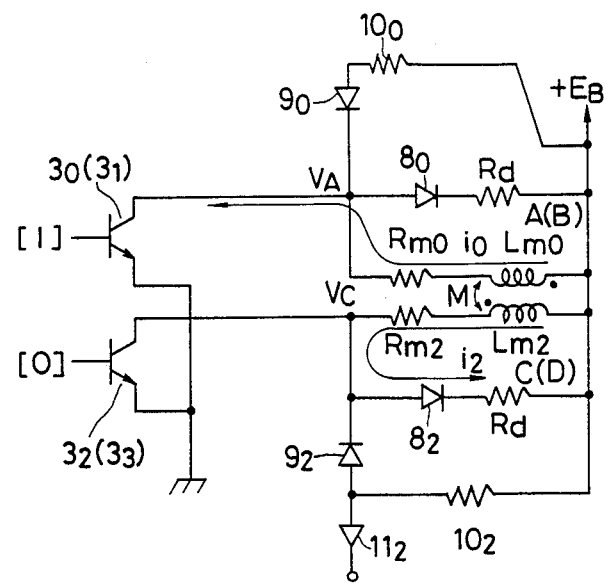
FIGS. 1(a) and 1(b) are circuit diagrams showing one example of a device for detecting an abnormal condition in a stepping motor according to the present invention.
Figure 1B:
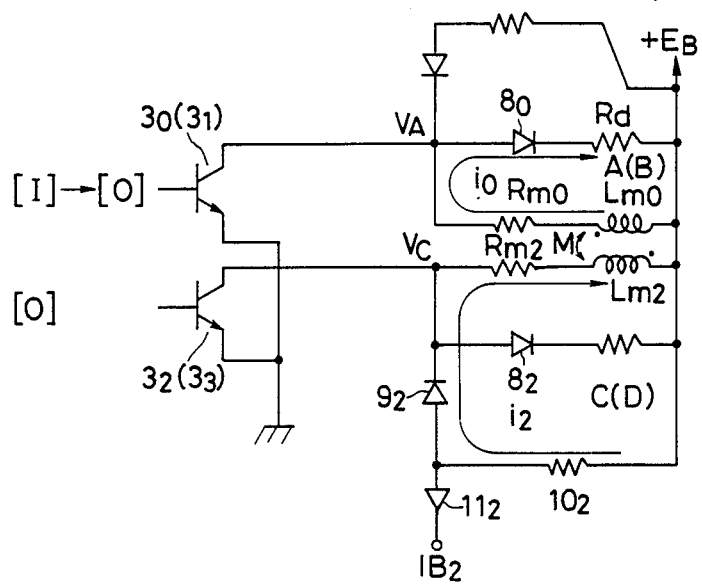

Since the coils A and C are wound on the common bobbin 8, as described above, there is a mutual induction between the coils A and C. Similarly, there is a mutual induction between the coils B and D. Since the arrangement of the coils A and C is the same as that of the coils B and D, only the arrangement of the coils A and C is shown in FIGS. 1(a) and 1(b). In FIG. 1(a), reference characters $Lm_0$, $Rm_0$ and $i_0$ designate the self-inductance, the internal resistance, and the current of the coil A, respectively. $Lm_2$, $Rm_0$ and $i_2$ represent the self-inductance, the internal resistance, and the current of the coil C respectively. A protective resistor $Rd$, is connected in series to each of the diodes $8_0$ and $8_2$. The mutual inductance between the coils A and C is represented by the character M.

FIG. 1(a) shows the flow paths of currents $i_0$ and $i_2$ provided when the transistor $3_0$ is conductive (on) and the transistor $3_2$ is non-conductive (off). Under this condition, the following expression (1) and (2) are established:

$$Lm_0 \frac{di_0}{dt} + M \frac{di_2}{dt} + Rm_0 \cdot i_0 = E_B \quad (1)$$

$$Lm_2 \frac{di_2}{dt} + M \frac{di_0}{dt} + (Rm_2 + Rd) \cdot i_2 = 0 \quad (2)$$

Figure 3A:
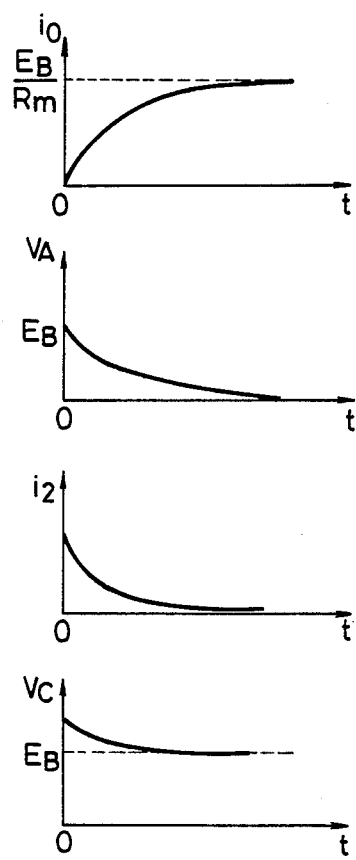
FIGS. 3(a) and 3(b) are graphical representations indicating currents and voltages of various circuit elements with respect to time.

If it is assumed that both the transistors $3_0$ and $3_2$ are stable in the non-conductive state until the time $t=0$, and at the time $t=0$ the signal "1" is provided at the output terminal $OA_0$ to render only the transistor $3_0$ conductive (on), then the currents $i_0$ and $i_2$ change in a manner as to meet the above-described expressions. The terminal voltages $V_A$ and $V_C$ of the coils A and C change as indicated in FIG. 3(a). That is, the current $i_0$ increases from zero and gradually approaches $E_B/Rm_0$. Therefore, the terminal voltage $V_A$ decreases from $E_B$, and gradually approaches zero. The mutual induction with the coil A causes the current $i_2$ to flow in the coil C with the protective circuit as a loop. The value of the current $i_2$ is maximum at the time instant $t_0$, and gradually falls to become zero. As for the terminal voltage of the coil C, a voltage due to the mutual inductance is added to the supply voltage $E_B$. That is, the terminal voltage of the coil C is higher than the supply voltage $E_B$ at the time instant $t_0$; however, it falls gradually to $E_B$.

FIG. 1(b) shows the flow paths of the currents $i_0$ and $i_2$. When the transistors $3_0$ and $3_2$ are both stable and respectively conductive and non-conductive until the time $t=0$ when the transistor $3_0$ is also rendered non-conductive (off). In this case, the following expressions can be established:

$$Lm_0 \frac{di_0}{dt} - M \frac{di_2}{dt} + (Rm_0 + Rd)i_0 = 0 \quad (3)$$

$$Lm_2 \frac{di_2}{dt} - M \frac{di_1}{dt} + (Rm_2 + Rd)i_2 = 0 \quad (4)$$

$$[i_0]_{t=0} = \frac{E_B}{Rm_0} \quad (5)$$

$$[i_2]_{t=0} = 0 \quad (6)$$

Figure 3B:
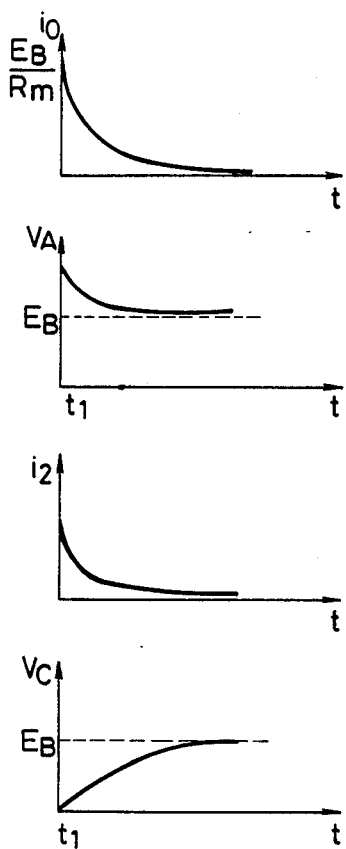

Therefore, the currents $i_0$ and $i_2$, and the terminal voltages $V_A$ and $V_C$ change as shown in FIG. 3(b). That is, the current $i_0$ gradually approaches zero from $E_B/Rm_0$, and the terminal voltage $V_A$ gradually approaches $E_B$ from a voltage which is higher than $E_B$ because of the counter electromotive force provided by the self-inductance.

On the other hand, the current $i_2$ flows in the loop of the coil C, the resistor $10_2$ and the diode $9_2$ owing to the mutual inductance. The value of the current $i_2$ is maximum at the time instant $t_0$, and gradually approaches zero. The terminal voltage $V_C$ of the coil C is the sum of the supply voltage $E_B$ and the terminal voltage (negative) of the resistor $10_2$. More specifically, the terminal voltage $V_C$ is $E_b - R10_2 \times i_2 \approx 0$ at the time instant $t=0$, and gradually approaches $E_B$.

If the time $t_1$ is set to a value close to zero, as is apparent from FIG. 1(b), the terminal voltage $V_C$ of the coil C is close to $E_B - R10_2 \times i_2 \approx 0$. If this terminal voltage is lower than the threshold value of the buffer $11_2$, then the "0" signal is applied to the input terminal $I_B$ of the microcomputer.

Figure 4A:
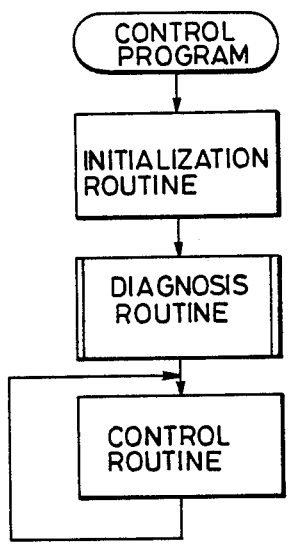
FIG. 4(a) is a flow chart of a control program.
Figure 4B:
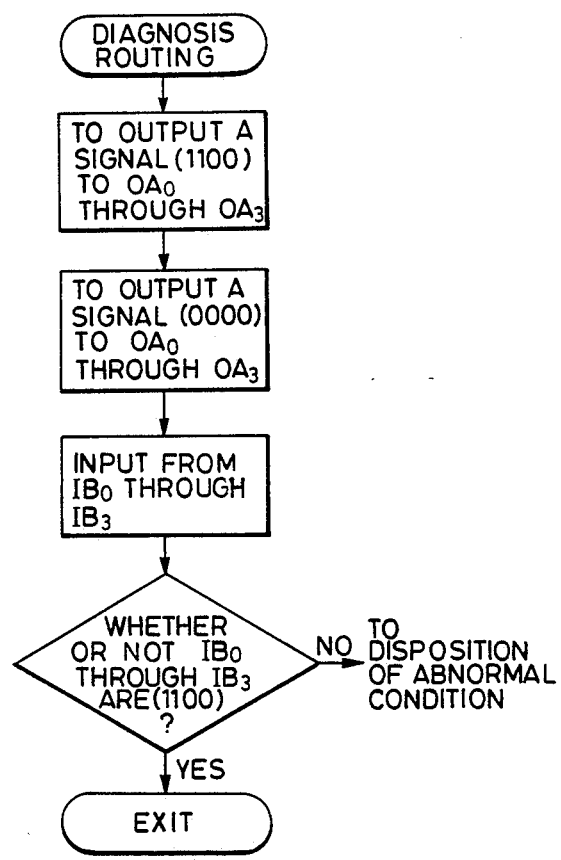
FIG. 4(b) is a flow chart of a diagnosis routine.

In the above-described embodiment of the present invention, the variations of the terminal voltages are utilized for self-diagnosis, and the control program is as shown in FIGS. 4(a) and 4(b). In a diagnosis routine shown in FIG. 4(b) first a signal (1 1 0 0) is provided at the output terminals $OA_0$ through $OA_3$. After the lapse of time for stabilization, i.e., after the time t has increased sufficiently in FIG. 3(a), a signal (0 0 0 0) is provided at the output terminals $OA_0$ through $OA_3$. Immediately thereafter, i.e., at the time instant $t_1$ in FIG. 3(b), the outputs of the buffers $11_0$ through $11_3$ are applied to the input terminals $IB_0$ through $IB_3$, and it is determined whether or not the outputs thus applied are (1 1 0 0).

If all the coils A, B, C and D are normal, and the driver circuit 3 is also normal, when the signal at the terminal $OA_0$ changes from "1" to "0", the signal at the terminal $IB_0$ is changed from "0" to "1", and the signal at the terminal $IB_2$ is changed from "1" to "0" as was described above. That is, at the time instant $t_1$ the output (1 1 0 0) is obtained, and it is determined that the stepping motor is normal.

If the coil A is broken, even when the signal at the terminal $OA_0$ is changed from "1" to "0", the current $i_0$ is maintained unchanged. Therefore, the current $i_2$ is not induced. Accordingly, the terminal voltage $V_C$ of the coil C is maintained at $E_B$, and the signal at the terminal $IB_2$ is also maintained at "1". In this case, although the coil A has been broken, the signal at the input terminal $IB_0$ is changed from "0" to "1" because of the supply voltage $E_B$ being applied through the resistor $10_0$ and the diode $9_0$. That is, when the coil A is broken, a signal (1 1 1 0) is applied to the input terminal $IB_0$ through $IB_3$, whereby it is determined that the stepping motor is in an abnormal state. When the coil B is broken, a signal (1 1 0 1) is applied to the input terminals $IB_0$ through $IB_3$. In the case when the coil C is broken, no induction current ($i_2$) flows in the coil. Therefore, the terminal voltage $V_C$ is maintained at $E_B$, and a signal "1" is applied to the input terminal $IB_2$. That is, the signal applied to the input terminals $IB_0$ through $IB_3$ is (1 1 1 0), and an abnormal condition can also be detected.

In the case also when any one of the transistors in the driver circuit 3 malfunctions, the signal applied to the input terminals $IB_0$ through $IB_3$ becomes abnormal. Therefore, the fact that the driver circuit is out of order can be detected.

In the above-described embodiment, basing on the mutual induction between the coils A and C, one of the coils is utilized as a search coil. However, in the case of a stepping motor which has no coil which can serve as a search coil, the same effect can be obtained by adding search coils. In this case, it is necessary to provide a search coil for each coil to be tested. On the other hand, in the above-described embodiment, the coils C and D serves as search coils, and the abnormal conditions of the coils C and D can be detected. Furthermore, in the above-described embodiment, the diagnosis routine is executed before the control routine. If the detecting device is so modified that the terminal voltage of the search coil is detected in association with the application and non-application of current to the coil during the control routine, then the presence or absence of an abnormal condition in the stepping motor can be detected at all times.

As was described above, in the detecting device of the present invention, the terminal voltage of the search coil, which is in the relation of mutual induction with the coil to be tested, is detected, and the terminal voltage thus detected is compared with the application and non-application of the supply voltage to the coil to be tested. Therefore, the abnormal condition of not only the coil to be tested but also the search coil can be detected, and accordingly the difficulty that the stepping motor is not correctly operated can be eliminated. In the case where the search coil is the drive coil of the stepping motor, the abnormal condition of not only the coil to be tested but also the search coil can be detected without the addition of special means to the stepping motor, i.e., it can be detected merely by monitoring the terminal voltage of the search coil.

It should be understood that the present invention is not limited to the particular embodiment described, but rather is susceptible to modifications, alternatives, and equivalent arrangements within the scope of the appended claims.

What is claimed is:

1. Solid state apparatus of a motor for detecting an abnormal condition in a first phase coil of the motor, comprising:
    a second phase coil of the motor disposed such that mutual induction exists between said second phase coil and the first phase coil, the first phase coil and said second phase coil each having a first end connected to a supply voltage of predetermined value;
    voltage applying means, comprising a semiconductor device, for selectively applying a first phase coil voltage to a second end of the first phase coil to produce a second phase coil voltage at a second end of said second phase coil which is greater than said predetermined supply voltage when the first phase coil is in an abnormal condition; and
    sensing means for sensing whether said second phase coil voltage is greater than said predetermined supply voltage at a time after said first phase coil voltage has been applied to determine whether the first phase coil is in said abnormal condition.

2. The solid state apparatus of claim 1, further including a bobbin upon which the first phase coil and said second phase coil are located.

3. The solid state apparatus of claim 2, wherein the first phase coil and said second phase coil are drive coils of a stepping motor.

4. The solid state apparatus of claim 1, further including a programmed microcomputer, said programmed microcomputer comprising said voltage applying means and said sensing means.

5. Solid state apparatus for detecting a break in a first drive coil of a stepping motor, comprising:
    a second drive coil of the stepping motor disposed such that mutual induction exists between the first drive coil and said second drive coil;
    voltage applying means, comprising a semiconductor device, for selectively applying a first drive coil voltage to the first drive coil to produce a second drive coil voltage, having a predetermined value, at an end of said second drive coil when there is a break in the first drive coil; and
    sensing means for sensing whether said second drive coil voltage is equal to said predetermined value at a time after said first drive coil voltage has been applied to determine whether the first drive coil has a break.

6. The solid state apparatus of claim 5, further including a bobbin upon which the first drive coil and said second drive coil are wound.

7. The solid state apparatus of claim 6, further including a programmed microcomputer, said programmed microcomputer comprising said voltage applying means and said sensing means.

* * * * *